(12) United States Patent
Hasegawa et al.

(10) Patent No.: US 10,236,459 B2
(45) Date of Patent: Mar. 19, 2019

(54) DISPLAY DEVICE AND METHOD FOR PRODUCING SAME

(71) Applicant: Sharp Kabushiki Kaisha, Sakai, Osaka (JP)

(72) Inventors: Masahiro Hasegawa, Sakai (JP); Yuki Yasuda, Sakai (JP); Takashi Ochi, Sakai (JP); Hiroshi Sugimoto, Sakai (JP); Shoji Okazaki, Sakai (JP); Kenji Misono, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/549,023

(22) PCT Filed: Jan. 29, 2016

(86) PCT No.: PCT/JP2016/000473
§ 371 (c)(1),
(2) Date: Aug. 4, 2017

(87) PCT Pub. No.: WO2016/125477
PCT Pub. Date: Aug. 11, 2016

(65) Prior Publication Data
US 2018/0026212 A1   Jan. 25, 2018

(30) Foreign Application Priority Data
Feb. 4, 2015  (JP) .................... 2015-020228

(51) Int. Cl.
*G06F 3/041*  (2006.01)
*H01L 51/00*  (2006.01)
(Continued)

(52) U.S. Cl.
CPC .......... *H01L 51/0097* (2013.01); *H01L 27/32* (2013.01); *H01L 27/3244* (2013.01);
(Continued)

(58) Field of Classification Search
CPC ............. H01L 21/0097; H01L 27/3244; H01L 51/5281; H01L 51/56; H01L 51/524
See application file for complete search history.

(56) References Cited

U.S. PATENT DOCUMENTS

| | | | | |
|---|---|---|---|---|
| 2013/0070431 A1* | 3/2013 | Fukuma | ................ | G06F 1/1652 361/749 |
| 2013/0076649 A1* | 3/2013 | Myers | ................. | H04M 1/0268 345/173 |

(Continued)

FOREIGN PATENT DOCUMENTS

| | | |
|---|---|---|
| JP | 2000-122039 A | 4/2000 |
| JP | 2013-068719 A | 4/2013 |

(Continued)

*Primary Examiner* — Julio J Maldonado
*Assistant Examiner* — Andre' C Stevenson
(74) *Attorney, Agent, or Firm* — ScienBiziP, P.C.

(57) ABSTRACT

Disclosed is a display device including: a display panel 40 including an element substrate 20 having a first resin substrate 10a over which a first underlayer film 11a and a plurality of switching elements are provided, and a counter substrate 30 having a second resin substrate 10b on which a second underlayer film 11b is provided; and a functional sheet 45 bonded to a surface, of the display panel 40, close to the counter substrate 30. The display device has a curved portion C in which the display panel 40 is able to be curved at a predetermined radius of curvature, and a pair of flat portions between which the curved portion C is interposed and a predetermined angle is formed, and in which the display panel 40 is held flatly. The functional sheet 45 is bonded such that the curved portion C is able to be maintained at the predetermined radius of curvature.

11 Claims, 6 Drawing Sheets

(51) Int. Cl.
*H01L 51/50* (2006.01)
*H01L 27/32* (2006.01)
*H01L 51/52* (2006.01)
*H01L 51/56* (2006.01)
*G09F 9/30* (2006.01)

(52) U.S. Cl.
CPC ............ *H01L 51/50* (2013.01); *H01L 51/524* (2013.01); *H01L 51/5281* (2013.01); *H01L 51/56* (2013.01); *G09F 9/301* (2013.01); *H01L 2227/323* (2013.01); *H01L 2251/5338* (2013.01)

(56) References Cited

U.S. PATENT DOCUMENTS

| | | |
|---|---|---|
| 2014/0240289 A1 | 8/2014 | Myers et al. |
| 2014/0361980 A1* | 12/2014 | Iwaki .................. G06F 3/14 345/156 |
| 2015/0130767 A1 | 5/2015 | Myers et al. |
| 2015/0227227 A1 | 8/2015 | Myers et al. |

FOREIGN PATENT DOCUMENTS

| | | |
|---|---|---|
| JP | 2013-118193 A | 6/2013 |
| JP | 2014-535086 A | 12/2014 |
| JP | 2015-015018 A | 1/2015 |
| WO | 2014087951 A1 | 6/2014 |

\* cited by examiner

DISPLAY DEVICE AND METHOD FOR PRODUCING SAME

TECHNICAL FIELD

The present invention relates to a display device and a method for producing such a display device.

BACKGROUND ART

In recent years, it has been proposed, for display devices such as organic electroluminescence (EL) display devices and liquid crystal display devices, to use a display panel including a resin substrate, instead of a conventionally used glass substrate.

For example, Patent Document 1 discloses an organic EL display device including an organic EL display panel and a circular polarizing plate provided on a surface of the organic EL display panel. In this display device, the extension axis of the circular polarizing plate is made to coincide with the direction in which the organic EL display panel is curved, in order to prevent contrast from varying.

CITATION LIST

Patent Documents

Patent Document 1: Japanese Unexamined Patent Publication No. 2013-118193

SUMMARY OF THE INVENTION

Technical Problem

Meanwhile, in a flexible organic EL display panel comprised of a resin substrate, at least one underlayer film made of an inorganic film is provided on the resin substrate, thereby reducing the entry of moisture from the resin substrate into an organic EL layer. In an organic EL display device including an organic EL display panel, a functional sheet such as a circular polarizing plate for reducing reflection of external light and a touch panel for touch operation may be bonded to a surface of the organic EL display panel. Here, in an organic EL display device including a flexible organic EL display panel comprised of the aforementioned resin substrate, and a functional sheet bonded to a surface of the flexible organic EL display panel, when the organic EL display panel is curved such that the side with the functional sheet is positioned inside or outside, the underlayer film formed on the resin substrate may be broken due to a tensile stress or a compressive stress applied to the underlayer film.

Further, in a flexible liquid crystal display panel comprised of a resin substrate, at least one underlayer film made of an inorganic film is also provided on the resin substrate, thereby reducing deterioration of an alignment film and a liquid crystal material which may be caused by moisture entering from the resin substrate. Therefore, also in a liquid crystal display device including such a flexible liquid crystal display panel comprised of a resin substrate and a functional sheet bonded to a surface of the flexible liquid crystal display panel, the underlayer film on the resin substrate may be broken, similarly to the case of the organic EL display device described above.

In view of the foregoing background, it is therefore an object of the present invention to reduce, in a display device including a display panel comprised of a resin substrate, and a functional sheet bonded to a surface of the resin substrate, breakage of an underlayer film formed on the resin substrate.

Solution to the Problem

To achieve the above object, a display device of the present invention includes a display panel. The display panel includes: an element substrate having a first resin substrate, a first underlayer film made of an inorganic film and provided on the first resin substrate, and a plurality of switching elements provided on the first underlayer film; and a counter substrate having a second resin substrate and a second underlayer film made of an inorganic film and provided on the second resin substrate, and arranged such that a side, of the counter substrate, close to the second underlayer film faces a side, of the element substrate, close to the plurality of switching elements; and a functional sheet bonded to a surface, of the display panel, close to the counter substrate. The display device has a curved portion in which the display panel is able to be curved at a predetermined radius of curvature, and a pair of flat portions between which the curved portion is interposed and a predetermined angle θ is formed, and in which the display panel is held flatly. The functional sheet is bonded such that the curved portion is able to be maintained at the predetermined radius of curvature.

A method for producing a display device of the present invention includes: fabricating a display panel by bonding an element substrate having a first resin substrate, a first underlayer film made of an inorganic film and provided on the first resin substrate, and a plurality of switching elements provided on the first underlayer film, to a counter substrate having a second resin substrate, a second underlayer film made of an inorganic film and provided on the second resin substrate such that the plurality of switching elements of the element substrate face the second underlayer film of the counter substrate; curving the display panel at a predetermined radius of curvature, thereby forming a curved portion and a pair of flat portions between which the curved portion is interposed and a predetermined angle is formed, and in which the display panel is held flatly; and bonding a functional sheet to a surface, of the display panel, close to the counter substrate, while shapes of the curved portion and the flat portions are maintained.

Advantages of the Invention

According to the present invention, the functional sheet is bonded to a surface, of the display panel, close to the counter substrate such that the curved portion of the display panel may be maintained at a predetermined radius of curvature. Therefore, the present invention may reduce, in the display device including the display panel comprised of a resin substrate, and a functional sheet bonded to a surface of the display panel, the breakage of the underlayer film on the resin substrate.

DESCRIPTION OF EMBODIMENTS

Embodiments of the present invention will now be described in detail with reference to the drawings. Note that the present invention is not limited to the following embodiments.

First Embodiment

Figure 1:
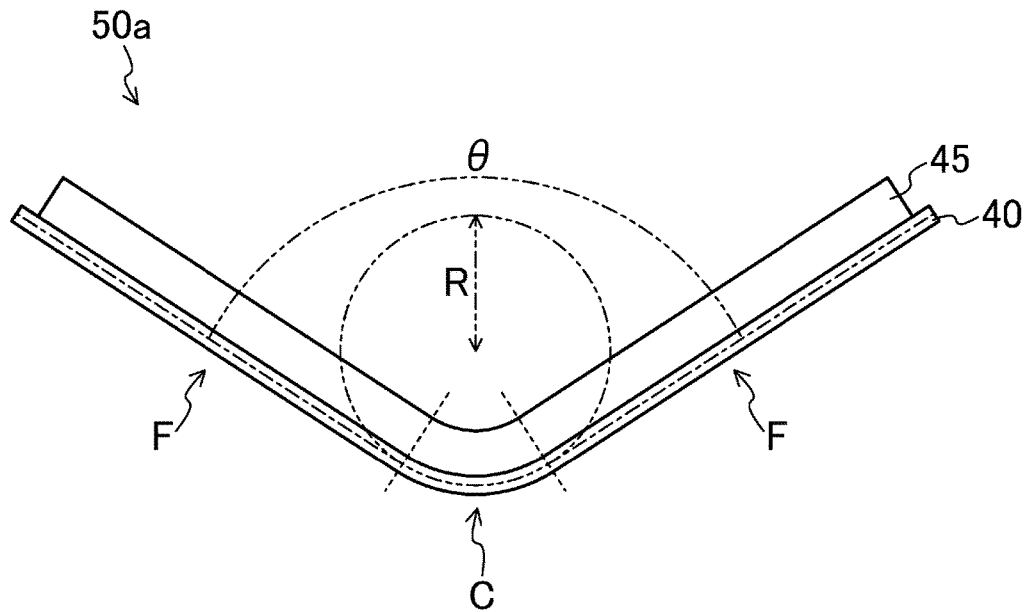
FIG. 1 is a schematic view of an organic EL display device according to a first embodiment of the present invention.
Figure 2:
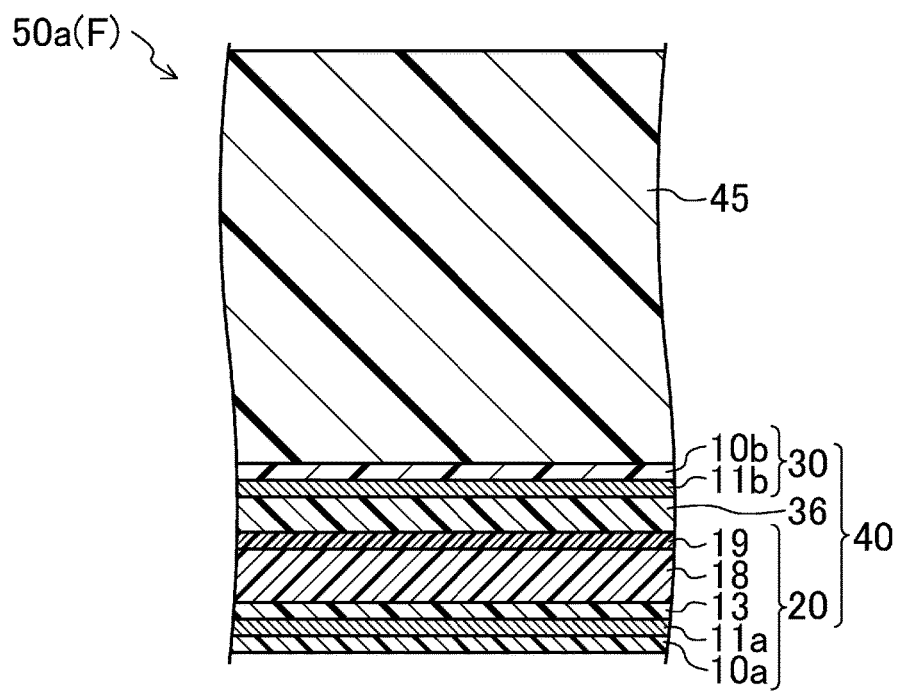
FIG. 2 is a cross-sectional view of a flat portion forming part of the organic EL display device according to the first embodiment of the present invention.
Figure 3:
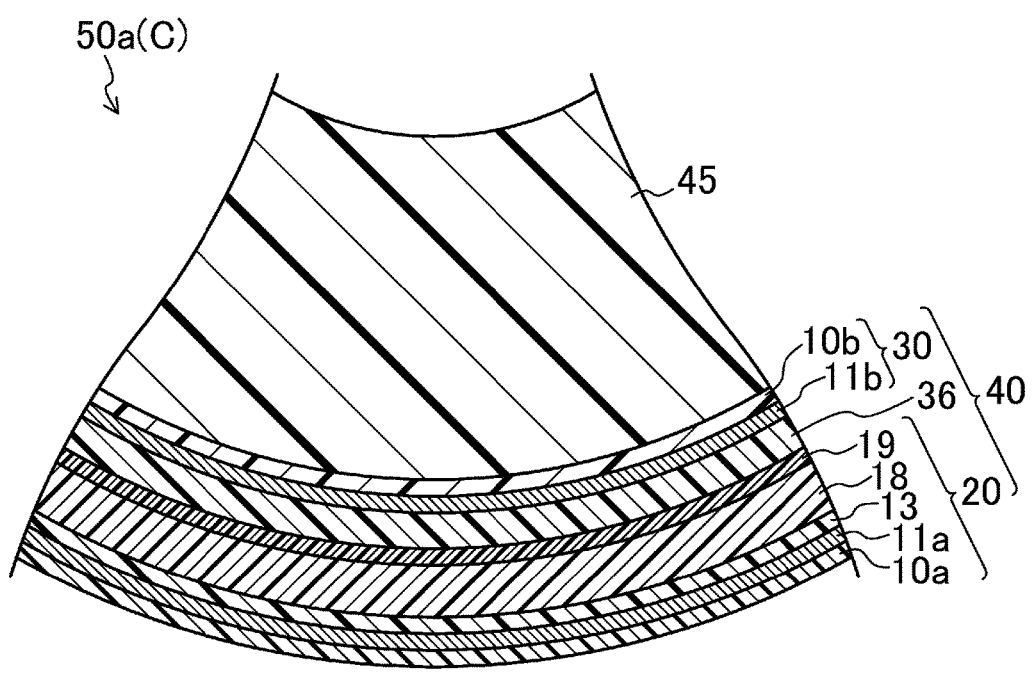
FIG. 3 is a cross-sectional view of a curved portion forming part of the organic EL display device according to the first embodiment of the present invention.
Figure 4:
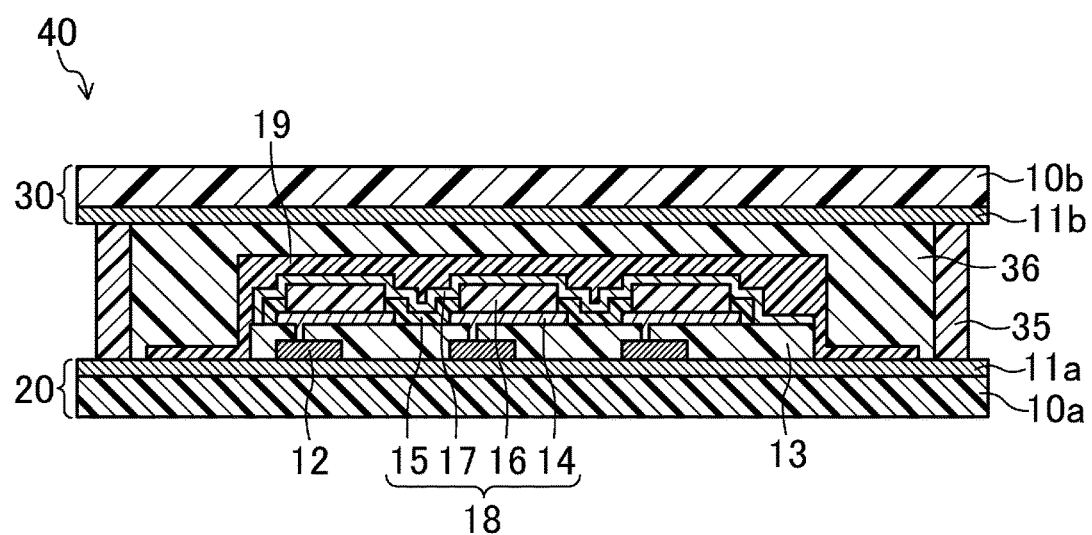
FIG. 4 is a cross-sectional view of an organic EL display panel forming part of the organic EL display device according to the first embodiment of the present invention.
Figure 5:
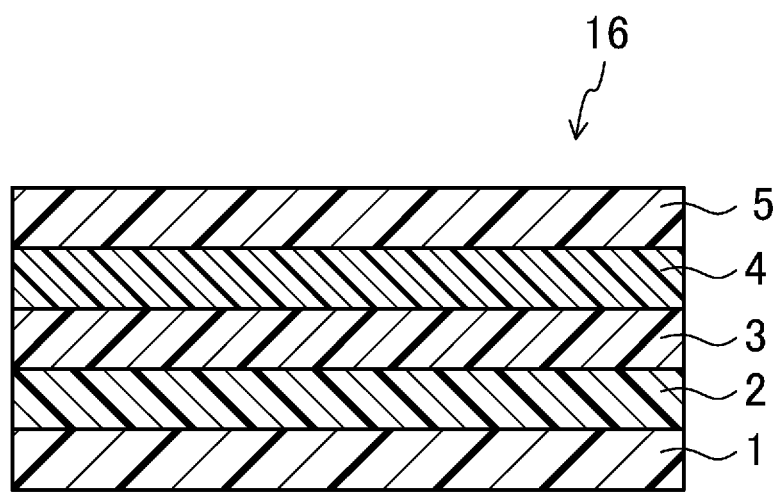
FIG. 5 is a cross-sectional view of an organic EL layer forming part of the organic EL display device according to the first embodiment of the present invention.
Figure 6:
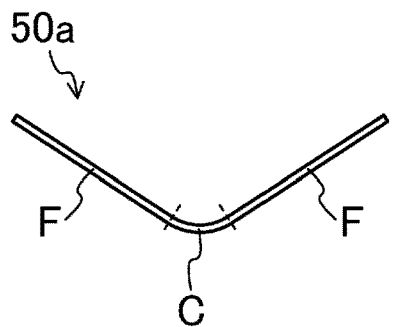
FIG. 6 is a schematic view illustrating a deformation pattern of the organic EL display device according to the first embodiment of the present invention.
Figure 7:
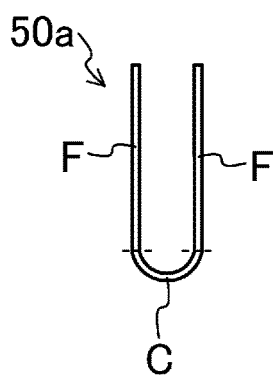
FIG. 7 is a schematic view illustrating a deformation pattern of the organic EL display device according to the first embodiment of the present invention.
Figure 8:
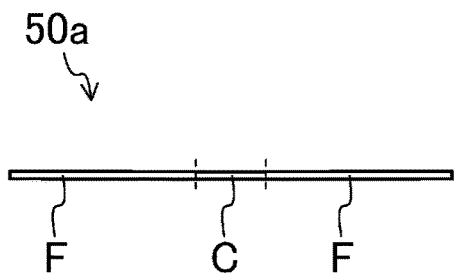
FIG. 8 is a schematic view illustrating a deformation pattern of the organic EL display device according to the first embodiment of the present invention.

FIGS. 1-9 illustrate a first embodiment of a display device according to the present invention. Specifically, FIG. 1 is a schematic view of an organic EL display device 50a according to this embodiment. FIG. 2 is a cross-sectional view of a flat portion F forming part of the organic EL display device 50a. FIG. 3 is a cross-sectional view of a curved portion C forming part of the organic EL display device 50a. FIG. 4 is a cross-sectional view of an organic EL display panel 40 forming part of the organic EL display device 50a. FIG. 5 is a cross-sectional view of an organic EL layer 16 forming part of the organic EL display panel 40. FIGS. 6-8 are schematic views illustrating deformation patterns of the organic EL display device 50a.

As illustrated in FIGS. 1-3, the organic EL display device 50a includes the organic EL display panel 40 and a functional sheet 45 which is bonded to a surface, of the organic EL display panel 40, close to a counter substrate 30 which will be described later.

As illustrated in FIGS. 2-4, the organic EL display panel 40 includes: an element substrate 20 and the counter substrate 30 facing each other; a sealing material 35 having a frame shape and provided between the element substrate 20 and the counter substrate 30; and a filler 36 provided in a region surrounded by the sealing material 35 between the element substrate 20 and the counter substrate 30. Here, in the organic EL display panel 40, a display region configured to display images is defined in a rectangular shape inside the sealing material 35, and a plurality of pixels are arranged in a matrix in the display region. For example, each pixel includes sub-pixels arranged adjacent to each other. The sub-pixels include a sub-pixel for gradation display in red, a sub-pixel for gradation display in green, and a sub-pixel for gradation display in blue.

As illustrated in FIGS. 2-4, the element substrate 20 includes a first resin substrate 10a, and a first underlayer film 11a, a plurality of TFTs 12, an interlayer insulating film 13, an organic EL element 18, and a sealing film 19 which are provided sequentially over the first resin substrate 10a.

The first resin substrate 10a is a plastic substrate made of, for example, polyimide resin.

As illustrated in FIGS. 2-4, the first underlayer film 11a is provided on the first resin substrate 10a. Here, the first underlayer film 11a is, for example, an inorganic insulating film such as a silicon dioxide film or a silicon nitride film.

As illustrated in FIGS. 2-4, each TFT 12 is a switching element provided on the first underlayer film 11a for a respective one of the sub-pixels. Here, each TFT 12 includes, for example: a gate electrode provided on the first underlayer film 11a; a gate insulating film covering the gate electrode; a semiconductor layer provided on the gate insulating layer and overlapping with the gate electrode; and source and drain electrodes provided on the semiconductor layer and facing each other. Note that although each TFT 12 is configured as a bottom gate TFT as an example in this embodiment, each TFT 12 may be configured as a top gate TFT.

As illustrated in FIG. 4, the interlayer insulating film 13 covers each TFT 12, except a portion of the drain electrode of the TFT 12. Here, the interlayer insulating film 13 is made of, for example, a transparent organic resin material such as acrylic resin.

As illustrated in FIG. 4, the organic EL element 18 includes a plurality of first electrodes 14, an edge cover 15, a plurality of organic EL layers 16, and a second electrode 17 which are sequentially provided over the interlayer insulating film 13.

As illustrated in FIG. 4, the plurality of first electrodes 14 are arranged in a matrix on the interlayer insulating film 13 such that each first electrode 14 corresponds to a respective one of the plurality of sub-pixels. Here, as illustrated in FIG. 4, the first electrodes 14 are connected to the drain electrodes of the TFTs 12 via contact holes formed in the interlayer insulating film 13. The first electrodes 14 have a function of injecting holes (positive holes) into the organic EL layers 16. To increase the efficiency in injecting positive holes into the organic EL layers 16, the first electrodes 14 are beneficially made of a material having a high work function. Examples of materials for the first electrodes 14 include, but are not limited to, metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The first electrodes 14 may also be made of an alloy of, for example, magnesium (Mg)/copper (Cu), magnesium (Mg)/silver (Ag), sodium (Na)/potassium (K), astatine (At)/astatine dioxide (AtO$_2$), lithium (Li)/aluminum (Al), lithium (Li)/calcium (Ca)/aluminum (Al), or lithium fluoride (LiF)/calcium (Ca)/aluminum (Al). The material for the first electrodes 14 may also be a conductive oxide such as tin oxide (SnO), zinc oxide (ZnO), indium tin oxide (ITO), and indium zinc oxide (IZO), for example. Moreover, the first electrodes 14 may be multilayers containing the above materials. Examples of materials having a high work function include, but are not limited to, indium tin oxide (ITO) and indium zinc oxide (IZO).

As illustrated in FIG. 4, the edge cover 15 is formed in a grid pattern to cover a peripheral portion of each first electrode 14. Examples of materials for the edge cover 15 include, but are not limited to, an inorganic film of silicon dioxide ($SiO_2$), silicon nitride ($SiN_x$, where x is a positive number) such as $Si_3N_4$ or silicon oxynitride (SiNO), and an organic film of polyimide resin, acrylic resin, polysiloxane resin, or novolak resin.

As illustrated in FIG. 4, the plurality of organic EL layers 16 are each provided on a respective one of the first electrodes 14, and are arranged in a matrix so as to correspond to the plurality of sub-pixels. Here, as shown in FIG. 5, each organic EL layer 16 includes a positive hole injection layer 1, a positive hole transport layer 2, a light-emitting layer 3, an electron transport layer 4, and an electron injection layer 5, which are sequentially provided over the associated first electrode 14.

The positive hole injection layer 1 is also called an anode buffer layer, and has the function of causing the energy levels of the first electrodes 14 and the organic EL layers 16 to approach each other and increasing the efficiency at which the first electrodes 14 inject positive holes into the organic EL layers 16. Here, examples of materials for the positive hole injection layer 1 include, but are not limited to, triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The positive hole transport layer 2 increases the efficiency at which positive holes are transported from the first electrodes 14 to the organic EL layers 16. Here, examples of materials for the positive hole transport layer 2 include, but are not limited to, porphyrin derivatives, aromatic tertiary amine compounds, styryl amine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

When a voltage is applied from the first electrodes 14 and the second electrode 17, positive holes and electrons are injected from the first and second electrodes 14 and 17 into the light-emitting layer 3, in which the positive holes and the electrons are recombined with each other. This light-emitting layer 3 is made of a material having high luminous efficiency. Examples of materials for the light-emitting layer 3 include, but are not limited to, metal oxinoid compounds (8-hydroxyquinoline metal complexes), naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bis(styryl)benzene derivatives, tris(styryl)benzene derivatives, perylene derivatives, perinone derivatives, aminopyrene derivatives, pyridine derivatives, rodamine derivatives, acridine derivatives, phenoxazone, quinacridone derivatives, rubrene, poly-p-phenylene vinylene, and polysilane.

The electron transport layer 4 functions to efficiently move electrons to the light-emitting layer 3. Here, examples of materials for the electron transport layer 4 includes, but are not limited to, as organic compounds, oxadiazole derivatives, triazole derivatives, benzoquinone derivatives, naphthoquinone derivatives, anthraquinone derivatives, tetracyanoanthraquinodimethan derivatives, diphenoquinone derivatives, fluorenone derivatives, silole derivatives, and metal oxinoid compounds.

The electron injection layer 5 has the function of causing the energy levels of the second electrode 17 and the organic EL layers 16 to approach each other and increasing the efficiency at which electrons are injected from the second electrode 17 into the organic EL layers 16. This function contributes to reduction of the drive voltage of the organic EL element 18. The electron injection layer 5 may also be called a cathode buffer layer. Here, examples of materials for the electron injection layer 5 include, but are not limited to, inorganic alkaline compounds such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As illustrated in FIG. 4, the second electrode 17 covers the organic EL layers 16 and the edge cover 15. The second electrode 17 has the function of injecting electrons into the organic EL layers 16. To increase the efficiency in injecting electrons into the organic EL layers 16, the second electrode 17 is beneficially made of a material having a low work function. Here, examples of materials for the second electrode 17 include, but are not limited to, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), or lithium fluoride (LiF). The second electrode 17 may also be made of an alloy of magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), and lithium fluoride (LiF)/calcium (Ca)/aluminum (Al). The second electrode 17 may also contain a conductive oxide such as tin oxide (SnO), zinc oxide (ZnO), indium tin oxide (ITO), or indium zinc oxide (IZO). Moreover, the second electrode 17 may be multilayers containing the above materials. Examples of material having a low work function include, but are not limited to, magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 4, the sealing film 19 covers the organic EL element 18. The sealing film 19 has the function of protecting the organic EL element 18 against moisture and oxygen. Here, examples of materials for the sealing layer 19 include, but are not limited to, inorganic materials such as silicon dioxide ($SiO_2$), aluminum oxide ($Al_2O_3$), and silicon nitride ($SiN_x$, where x is a positive number) such as $Si_3N_4$, and organic materials such as acrylate, polyurea, parylene, polyimide, and polyamide.

As illustrated in FIGS. 2-4, the counter substrate 30 includes a second resin substrate 10b, and a second underlayer film 11b provided on the second resin substrate 10b.

The second resin substrate 10b is a plastic substrate made of, for example, polyimide resin.

The second underlayer film 11b is, for example, an inorganic insulating film such as a silicon dioxide film or a silicon nitride film.

The sealing material 35 is provided to bond a peripheral portion of the element substrate 20 to a peripheral portion of the counter substrate 30. Examples of materials for the sealing material 35 include, but are not limited to, epoxy resin, acrylic resin, polyimide resin, and phenol resin which are UV curable and/or thermosetting.

The filler 36 functions as a getter (i.e., has the function of adsorbing oxygen, moisture, and other substances). Examples of materials for the filler 36 include, but are not limited to, epoxy resin and silicon resin which are thermosetting. Moreover, the filler 36 contains, for example, a metal oxide such as calcium oxide (CaO), barium oxide (BaO), and aluminum oxide ($Al_2O_3$), active carbon, silica gel, and zeolite.

The functional sheet 45 is configured to reduce reflection of external light. Here, the functional sheet 45 is, for example, a circular polarizing plate formed by combining a polarizing plate and a quarter wave plate, or an antireflective film comprised of a base film coated with a low-refractive material.

As illustrated in FIG. 1, the organic EL display device 50a with the configuration described above has a curved portion C in which the organic EL display panel 40 is curved at a predetermined radius of curvature R (equal to or larger than 10 mm and equal to or smaller than 50 mm), and a pair of flat portions F between which the curved portion C is interposed and a predetermined angle θ (equal to or larger than 45° and equal to or smaller than 135°) is formed. As illustrated in FIG. 1, the curved portion C is curved such that the functional sheet 45 is positioned inside. As illustrated in FIG. 1, the organic EL display panel 40 is held flatly in the flat portions F. Note that the functional sheet 45 is bonded such that the curved portion C may be maintained at the predetermined radius of coverture R. Here, the organic EL display device 50a is produced by a production method which will be described later such that the organic EL display device 50a has the curved portion C which has the predetermined radius of curvature R and the pair of the flat portions F between which the curved portion C is interposed and the predetermined angle θ is formed. The organic EL display device 50a is basically configured to maintain its shape (the radius of curvature R and the angle θ), but also capable of deforming in accordance with numerical variations in the radius of curvature R and the angle θ, which are caused when the pair of the flat portions F opens and closes due to their own weights. The organic EL display device 50a has a resilient property. Specifically, for example, when the organic EL display device 50a is at least deformed and flattened such that the flat portions F between which the curved portion C is interposed form an angle of 180°, a tensile stress acts on a surface of the functional sheet 45 while a compressive stress acts on a surface of the organic EL display panel 40. As a result, a bending stress is applied to the organic EL display panel 40, and in response to this, the organic EL display device 50a behaves to restore its original shape (the radius of curvature R and the angle θ).

Further, the organic EL display device 50a with the configuration described above may be deformed as illustrated in FIGS. 6-8. Specifically, when the pair of flat portions F is closed from the state illustrated in FIG. 6 (equivalent to the state illustrated in FIG. 1), the organic EL display device 50a is deformed to enter the state illustrated in FIG. 7 where the flat portions F face each other. When the pair of flat portions F is opened from the state illustrated in FIG. 6 (equivalent to the state illustrated in FIG. 1), the organic EL display device 50a is deformed to enter the state illustrated in FIG. 8 where the pair of flat portions F and the curved portion C are positioned on the same plane. That is to say, the organic EL display device 50a has the pair of the flat portions F that may be folded up about the curved portion C.

In the organic EL display device 50a with the configuration described above, if the radius of curvature R of the curved portion C were smaller than 10 mm, air bubbles would be easily introduced during bonding of the functional sheet 45 to the surface of the organic EL display panel 40. If the radius of curvature R of the curved portion C were larger than 50 mm, an increased stress would be applied to the first underlayer film 11a on the first resin substrate 10a during bending of the organic EL display device 50a, and the first underlayer film 11a could be easily broken. If the angle θ formed between the pair of flat portions F were smaller than 45°, it would be difficult to deform and flatten the organic EL display device 50a. If the angle θ formed between the pair of flat portions F were larger than 135°, an increased stress would be applied to the first underlayer film 11a on the first resin substrate 10a and the first underlayer film 11a could be easily broken.

Described next is a method for producing the organic EL display device 50a according to this embodiment. Here, reference is made to FIG. 9, which is a schematic view illustrating the method for producing the organic EL display device 50a. The method for producing the organic EL display device 50a according to this embodiment includes a panel fabrication step, a curving step, and a bonding step.

<Panel Fabrication Step>

For example, an element substrate 20 is prepared by forming, by a known method, a first underlayer film 11a, TFTs 12, an interlayer insulating film 13, an organic EL element 18 (including first electrodes 14, an edge cover 15, organic EL layers 16 (including a positive hole injection layer 1, a positive hole transport layer 2, a light-emitting layer 3, an electron transport layer 4, and an electron injection layer 5), and a second electrode 17) and a sealing film 19 over a surface of a first resin substrate 10a made of polyimide resin.

For example, a counter substrate 30 is prepared by forming, by a known method, a second underlayer film 11b on a surface of a second resin substrate 10b made of polyimide resin.

Further, a sealing resin is applied to a surface of the element substrate 20 by, for example, the dispending method, in a frame shape, and a filler resin is dropped onto and placed in the inside of the sealing resin.

Subsequently, the element substrate 20 on which the sealing resin and the filler resin have been arranged is bonded to the counter substrate 30 in a reduced-pressure atmosphere. Thereafter, the reduced-pressure atmosphere is released, thereby applying a pressure to the outer surfaces of the element substrate 20 and the counter substrate 30.

Further, for example, the sealing resin sandwiched between the element substrate 20 and the counter substrate 30 is irradiated with UV. Thereafter, the sealing resin and the filler resin are cured by heating the irradiated panel, thereby forming a sealing material 35 and the filler 36.

In this manner, the organic EL display panel 40 may be fabricated.

<Curving Step>

Figure 9:
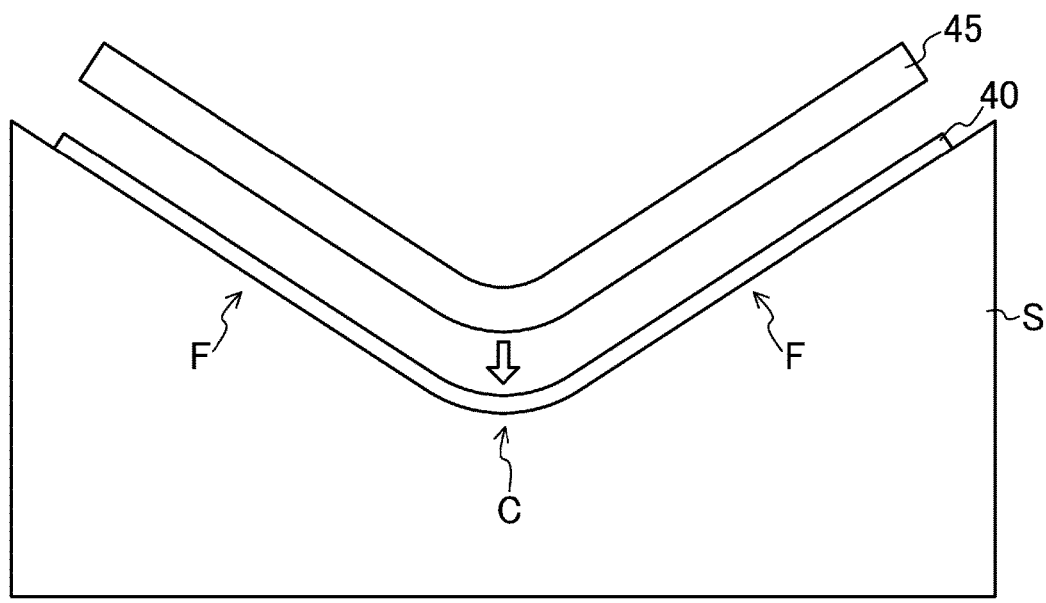
FIG. 9 is a schematic view illustrating a method for producing the organic EL display device according to the first embodiment of the present invention.

As illustrated in FIG. 9, a stage S including a setting plane having a generally V-shaped transverse section is provided. The organic EL display panel 40 is suctioned onto and held on the setting plane of the stage S such that its side close to the element substrate 20 faces the setting plane. As a result, the organic EL display panel 40 is curved at a predetermined radius of curvature R, thereby forming a curved portion C and a pair of flat portions F between which the curved portion C is interposed and a predetermined angle θ is formed.

<Bonding Step>

As illustrated in FIG. 9, a functional sheet 45 is bonded to the surface, of the organic EL, display panel 40 held on the stage S, close to the counter substrate 30.

In this manner, the organic EL display device 50a of this embodiment may be produced.

Next, some experiments which were actually conducted will be described.

As Example 1 of this embodiment, an organic EL display panel having a thickness of 50 μm was first fabricated by the method described above. Thereafter, while the fabricated organic EL display panel was maintained such that its curved portion C had a radius of curvature R of 15 mm and its pair of flat portions F formed an angle θ of 100°, a circular polarizing plate (product name: "NZD-CMEQHC", manufacturer: NITTO DENKO CORPORATION) having a thickness of 120 μm was bonded to a surface, of the organic EL display panel, close to the counter substrate. In this manner, an organic EL display device was prototyped.

As Example 2 of this embodiment, an organic EL display panel having a thickness of 50 μm was first fabricated by the method described above. Thereafter, while the fabricated organic EL display panel was maintained such that its curved portion C had a radius of curvature R of 15 mm and its pair of flat portions F formed an angle θ of 100°, an antireflective film (product name: "ReaLook® 9900," manufacturer: NOF Corporation) having a thickness of 100 μm was bonded to a surface, of the organic EL display panel, close to the counter substrate, using an adhesive (product name: "PD-S1," manufacture: PANAC Co., Ltd.) applied in a thickness of 25 μm. In this manner, an organic EL display device was prototyped.

As Example 3 of this embodiment, an organic EL display panel having a thickness of 50 μm was first fabricated by the method described above. Thereafter, while the fabricated organic EL display panel was maintained such that its curved portion C had a radius of curvature R of 15 mm and its pair of flat portions F formed an angle θ of 80°, a circular polarizing plate (product name: "NZD-CMEQHC", manufacturer: NITTO DENKO CORPORATION) was bonded to a surface, of the organic EL display panel, close to the counter substrate. In this manner, an organic EL display device was prototyped.

Further, as a comparative example of this embodiment, an organic EL display panel having a thickness of 50 μm was first fabricated by the method described above. Thereafter, while the fabricated organic EL display panel was maintained to be flat, a circular polarizing plate (product name: "NZD-CMEQHC", manufacturer: NITTO DENKO CORPORATION) was bonded to a surface, of the organic EL display panel, close to the counter substrate. In this manner, an organic EL display device was prototyped.

The prototyped organic EL display devices of the Examples 1-3 and comparative example described above were subjected to a bending test, using a bending tester (product name: TCD111L, manufacturer: YUASA SYSTEM Co., Ltd.). In the test, each prototyped display device was bent 10,000 times at a radius of curvature of 5 mm. After the test, the first underlayer film of each prototyped display device was observed for cracks by using an optical microscope.

The test results showed that no cracks were observed in the first underlayer film of each of the organic EL display devices of Examples 1-3, whereas cracks were observed in the first underlayer film of the organic EL display device of the comparative example.

As described above, the organic EL display device 50a of this embodiment and the production method thereof may provide the following advantages.

1 In the panel fabrication step, the element substrate 20 including the first resin substrate 10a, the first underlayer film 11a, and the switching elements 12 is bonded to the counter substrate 30 including the second resin substrate 10b and the second underlayer film 11b such that the side, of the element substrate 20, close to the switching elements 12 faces the side, of the counter substrate 30, close to the second underlayer film 11b, thereby fabricating the organic EL display panel 40. Thereafter, in the curving step, the organic EL display panel 40 is curved at the predetermined radius of curvature R, thereby forming the curved portion C, and the pair of flat portions F between which the curved portion C is interposed and the predetermined angle θ is formed and in which the organic EL display panel 40 is held flatly. Subsequently, in the bonding step, while the shapes of the curved portion C and the flat portions F of the organic EL display panel 40 are maintained, the functional sheet 45 is bonded to the surface, of the organic EL display panel 40, close to the counter substrate 30. As a result, the functional sheet 45 is bonded to the surface, of the organic EL display panel 40, close to the counter substrate 30 such that the curved portion C of the organic EL display panel 40 may be maintained at the predetermined radius of curvature R. Thus, the organic EL display device 50a has been curved at the predetermined radius of curvature R in advance. Therefore, for example, if the organic EL display device 50a is deformed to be further bent, the amount in which the organic EL display device 50a is bent may be smaller than in the case where an organic EL display device is entirely flat. As a result, during bending of the organic EL display device 50a, a reduced stress is applied to the first underlayer film 11a on the first resin substrate 10a in the curved portion C, which contributes to reduction in breakage of the first underlayer film 11a. Thus, in the organic EL display device 50a including the organic EL display panel 40 having the first and second resin substrates 10a and 10b, and the functional sheet 45 bonded to the surface, of the organic EL display panel 40, close to the counter substrate 30, a reduction in the breakage of the underlayer film 11a on the first resin substrate 10a may be achieved.

Here, if the organic EL display panel (40) having no functional sheet (45) bonded thereto is bent alone, a neutral plane to which substantially no stress is applied exists in the organic EL display panel (40), and the distance between the neutral plane and the first underlayer film (11a) becomes relatively short. Therefore, if the organic EL display panel (40) is bent alone, the first underlayer film (11a) may be hardly broken. In contrast, if the organic EL display panel (40) having the functional sheet (45), which has been bonded to a surface of the organic EL display panel (40) held entirely flatly, is bent, the neutral plane to which substantially no stress is applied is shifted toward the functional sheet (45). Accordingly, the distance between the neutral plane and the first underlayer film (11a) becomes relatively long. As a result, an increased stress is applied to the first underlayer film (11a), which facilitates the breakage of the first underlayer film 11a. Note that, since the panel described in this paragraph is not of this embodiment, but of the comparative example, the components corresponding to those of this embodiment are denoted by parenthesized reference characters.

2 The radius of curvature R of the curved portion C of the organic EL display panel 40 is equal to or larger than 10 mm and equal to or smaller than 50 mm. This may reduce not only the entry of air bubbles during bonding of the functional sheet 45 to the surface of the organic EL display panel 40, but also the breakage of the first underlayer film 11a on the first resin substrate 10a. Further, the angle θ formed between the pair of flat portions F of the organic EL display panel 40 is equal to or larger than 45° and equal to or smaller than 135°. This may make it easy to deform and flatten the organic EL display device 50a, and contribute to reduction in the breakage of the first underlayer film 11a on the first resin substrate 10a.

3 Since the pair of the flat portions F is foldable about the curved portion C, the organic EL display device 50a may be folded up compactly and opened to be flat to be flat.

4 Since the element substrate 20 includes the organic EL element 18, a self-luminous display device may be implemented.

5 The functional sheet 45, which is configured to reduce reflection of external light, contributes to reduction in the light reflected from the surface of the functional sheet 45, i.e., the surface of the organic EL display device 50a.

Second Embodiment

Figure 10:
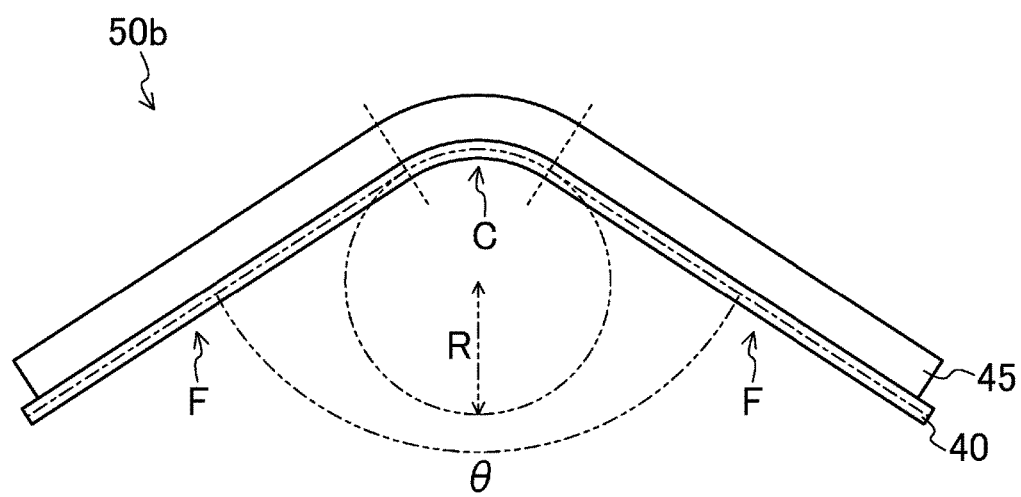
FIG. 10 is a schematic view of an organic EL display device according to a second embodiment of the present invention.

FIG. 10 is a schematic view of an organic EL display device 50b according to this embodiment. In the following embodiments, components equivalent to those illustrated in FIGS. 1-9 are denoted by the same reference characters, and the detailed explanation thereof will be omitted.

In the first embodiment, the organic EL display device 50a that is curved such that its side close to functional sheet 45 is bent in a generally V-shape has been exemplified. In this embodiment, the organic EL display device 50b which is curved such that its side close to the organic EL display panel 40 is bent in a generally V-shape will be exemplified.

As illustrated in FIG. 10, the organic EL display device 50b includes an organic EL display panel 40 and a functional sheet 45 which is bonded to a surface, of the organic EL display panel 40, close to a counter substrate 30. As illustrated in FIG. 10, the organic EL display device 50b also has a curved portion C in which the organic EL display panel 40 is curved at a predetermined radius of curvature R (equal to or larger than 10 mm and equal to or smaller than 50 mm), and a pair of flat portions F between which the curved portion C is interposed and a predetermined angle θ (equal to or larger than 45° and equal to or smaller than 135°) is formed. As illustrated in FIG. 10, the curved portion C is curved such that the functional sheet 45 is positioned outside.

The organic EL display device 50b with the configuration above described may be produced according to the method described in the first embodiment and by providing a stage including a setting plane having a transverse section in a generally inverted V-shape.

As an example of this embodiment, an organic EL display panel having a thickness of 50 μm was fabricated by the production method described above. Thereafter, while the fabricated organic EL display panel was maintained such that its curved portion C had a radius of curvature R of 15 mm and its pair of flat portions F formed an angle of 100°, a circular polarizing plate (product name: "NZD-CMEQHC", manufacturer: NITTO DENKO CORPORATION) was bonded to a surface, of the organic EL display panel, close to the counter substrate. In this manner, an organic EL display device was prototyped. Just like the first embodiment, the prototyped organic EL display device was subjected to a bending test, using a bending tester (product name: TCD111L, manufacturer: YUASA SYSTEM Co., Ltd.). In the test, the prototyped display device was bent 10,000 times at a radius of curvature of 5 mm. After the test, the first underlayer film was observed for cracks by using an optical microscope. The test result showed that no cracks were observed in the first underlayer film of the organic EL display devices of this embodiment.

As described above, the organic EL display device 50b of this embodiment and the production method thereof may provide the advantages 1-5 described above.

Third Embodiment

Figure 11:
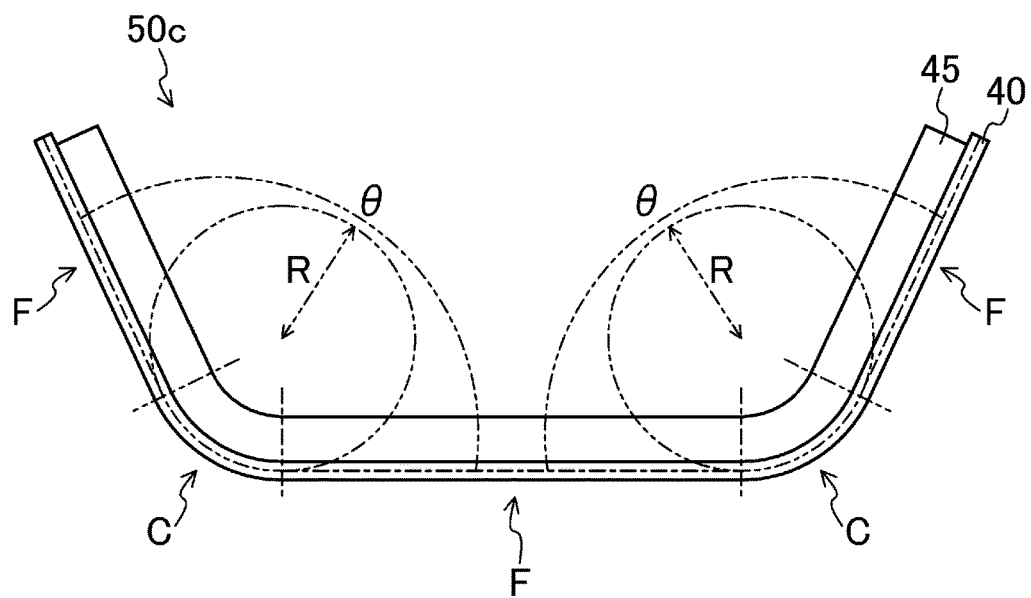
FIG. 11 is a schematic view of an organic EL display device according to a third embodiment of the present invention.

FIG. 11 is a schematic view of an organic EL display device 50c according to this embodiment.

In the first and second embodiments, the organic EL display devices 50a and 50b each having one curved portion C have been exemplified. In this embodiment, the organic EL display device 50c which has two curved portions C will be exemplified.

As illustrated in FIG. 11, the organic EL display device 50c includes an organic EL display panel 40 and a functional sheet 45 which is bonded to a surface, of the organic EL display panel 40, close to a counter substrate 30. As illustrated in FIG. 11, the organic EL display device 50c has a first flat portion F, a first curved portion C, a second flat portion F, a second curved portion C, and a third flat portion F, which are arranged from left to right in the figure. Here, in the first and second curved portions C, the organic EL display panel 40 is curved at a predetermined radius of curvature R (equal to or larger than 10 mm and equal to or smaller than 50 mm). As illustrated in FIG. 11, the first and second curved portions C are curved such that the functional sheet 45 is positioned inside. The first and second flat portions F are provided such that the first curved portion C is interposed and a predetermined angle θ (equal to or larger than 45° and equal to or smaller than 135°) is formed between the first and second flat portions F. The second and third flat portions F are provided such that the second curved portion C is interposed and a predetermined angle θ (equal to or larger than 45° and equal to or smaller than 135°) is formed between the second and third flat portions F.

The organic EL display device 50c with the configuration described above may be produced according to the method described in the first embodiment and by providing a stage including a setting plane having a generally V-shaped transverse section.

As described above, the organic EL display device 50c of this embodiment and the production method thereof may provide the advantages 1-5 described above.

In this embodiment, the organic EL display device 50c having the first and second curved portions C that are curved such that the functional sheet 45 is positioned inside has been exemplified. However, the organic EL display device may have a first curved portion (C) which is curved such that a functional sheet (45) is positioned inside, and a second curved portion (C) which is curved such that the functional sheet (45) is positioned outside.

In this embodiment, the organic EL display devices 50c having the three flat portions F and two curved portions C interposed between the three flat portions F has been exemplified. However, the present invention is applicable to an organic EL display device which has n flat portions (F)

(where n is a natural number equal to or larger than 4) and (n−1) curved portions C interposed between the n flat portions (F).

Other Embodiments

In each of the above embodiments, the display device has been exemplified as an organic EL display device including an organic EL display panel. However, the present invention is applicable to, for example, a liquid crystal display device including a liquid crystal display panel.

Further, in each of the above embodiments, the functional sheet has been exemplified as a sheet configured to reduce reflection of external light. However, the functional sheet may be configured as a flexible touch panel, a hard coat film, or a mirror film, for example.

Moreover, in each of the above embodiments, the organic EL layer has been exemplified as a layer having a stacked structure of the five layers, namely, the positive hole injection layer, a positive hole transport layer, the light-emitting layer, the electron transport layer, and the electron injection layer. However, the organic EL layer may have a stacked structure of three layers including a positive hole injection and transport layer, a light-emitting layer, and an electron transport and injection layer, for example.

In each of the above embodiments, the organic EL display device in which the first electrode functions as the anode and the second electrode functions as the cathode has been exemplified. However, the present invention is applicable to an organic EL display device which has an inverted stacked structure and in which the first electrode functions as the cathode and the second electrode functions as the anode.

In each of the above embodiments, the organic EL display device including the element substrate in which an electrode of the TFT connected to the first electrode is denoted as the drain electrode has been exemplified. However, the present invention is applicable to an organic EL display device including an element substrate in which the electrode of the TFT connected to the first electrode is called a source electrode.

INDUSTRIAL APPLICABILITY

As described above, the present invention is useful for a flexible display device.

DESCRIPTION OF REFERENCE CHARACTERS

C Curved Portion
F Flat Portion
10a First Resin Substrate
10b Second Resin Substrate
11a First Underlayer Film
11b Second Underlayer Film
12 TFT (Switching Element)
18 Organic EL Element
20 Element Substrate
30 Counter Substrate
40 Organic EL Display Panel
45 Functional Sheet
50a-50c Organic EL Display Device

The invention claimed is:

1. A display device comprising:
a display panel including
an element substrate having a first resin substrate, a first underlayer film made of an inorganic film and provided on the first resin substrate, and a plurality of switching elements provided on the first underlayer film; and
a counter substrate having a second resin substrate and a second underlayer film made of an inorganic film and provided on the second resin substrate, and arranged such that a side, of the counter substrate, close to the second underlayer film faces a side, of the element substrate, close to the plurality of switching elements; and
a functional sheet bonded to a substrate, of the display panel, close to the counter substrate, wherein
the display device has
a curved portion in which the display panel is able to be curved at a predetermined radius of curvature, and
a pair of flat portions between which the curved portion is interposed and a predetermined angle is formed, and in which the display panel is held flatly, and
the functional sheet is bonded such that the curved portion is able to be maintained at the predetermined radius of curvature,
when the display device is deformed and flattened such that the flat portions between which the curved portion is interposed to form an angle of 180°, a tensile stress acts on a surface of the functional sheet while a compressive stress acts on a surface of the display panel.

2. The display device of claim 1, wherein
the predetermined radius of curvature is equal to or larger than 10 mm and equal to or smaller than 50 mm, and
the predetermined angle is equal to or larger than 45° and equal to or smaller than 135°.

3. The display device of claim 1, wherein
the pair of flat portions is foldable about the curved portion.

4. The display device of claim 1, wherein
the element substrate is provided with an organic EL element.

5. The display device of claim 1, wherein
the functional sheet is configured to reduce reflection of external light.

6. The display device of claim 1, wherein, wherein
the curved portion is curved such that a side close to the functional sheet is curved in a generally V-shape.

7. The display device of claim 1, wherein
the curved portion is curved such that a side close to the display panel is curved in a generally V-shape.

8. The display device of claim 1, wherein
a different curved portion in which the display panel is able to be curved at the predetermined radius of curvature is provided opposite to the curved portion with respect to one of the pair of the flat portions, and
a different flat portion in which the display panel is held flatly is provided such that the different curved portion is interposed and the predetermined angle is formed between the different flat portion and the one of the pair of flat portions.

9. A method for producing a display device, the method comprising:
fabricating a display panel by bonding an element substrate having a first resin substrate, a first underlayer film made of an inorganic film and provided on the first resin substrate, and a plurality of switching elements provided on the first underlayer film, to a counter substrate having a second resin substrate and a second underlayer film made of an inorganic film and provided on the second resin substrate, such that the plurality of switching elements of the element substrate face the second underlayer film of the counter substrate;

curving the display panel at a predetermined radius of curvature, thereby forming a curved portion and a pair of flat portions between which the curved portion is interposed and a predetermined angle is formed, and in which the display panel is held flatly; and bonding a functional sheet to a surface, of the display panel, close to the counter substrate, while shapes of the curved portion and the pair of flat portions are maintained.

10. The display device of claim 1, wherein the functional sheet is in a circular polarizing plate.

11. The display device of claim 1, wherein in the curved portion, when curved at the predetermined radius of curvature, the display panel and the functional sheet apply no stress to each other.

* * * * *